United States Patent
Snodgrass et al.

[19]

[11] Patent Number: 6,061,509
[45] Date of Patent: May 9, 2000

[54] METHOD AND APPARATUS FOR SIGNAL ROUTING TO ACHIEVE SIGNAL-EFFICIENCY

[75] Inventors: Charles K. Snodgrass; Robert L. Totorica; David A. Reichle; Charles S. Alexander, all of Boise, Id.

[73] Assignee: Micron Technology, Inc., Boise, Id.

[21] Appl. No.: 09/100,440

[22] Filed: Jun. 19, 1998

[51] Int. Cl.⁷ ........................................... G06F 17/50
[52] U.S. Cl. ............................................. 395/500.13
[58] Field of Search ................................ 395/500.13

[56] References Cited

U.S. PATENT DOCUMENTS 4,794,559 12/1988 Greenberger ........................ 365/49
5,459,856 10/1995 Inoue ................................... 711/113

Primary Examiner—Kevin J. Teska
Assistant Examiner—Hugh Jones
Attorney, Agent, or Firm—Williams, Morgan & Amerson, P.C.

[57] ABSTRACT

The present invention provides for a method and an apparatus for routing electrical signals. The method includes accessing a plurality of electrical circuits. The apparatus includes a supervisory circuit capable of delivering two access signals from a group of first, second, third, and fourth access signals, wherein the supervisory circuit is capable of delivering one of the first and third access signals, and one of the second and fourth access signals. A plurality of electrical circuits is organized into first and second rows. A first portion of the plurality of electrical circuits in the first and second rows, is coupled to a first access signal line. A second portion of the plurality of electrical circuits in the first and second rows is coupled to a second access signal line. The first and second portions of the plurality of electrical circuits in said first row are coupled to a third access signal. The first and second portions of said plurality of electrical circuits in the second row are coupled to a fourth access signal. An access signal is delivered on one of the first and third access signal lines and on one of the second and fourth access signal lines, the electrical circuits being accessed in response to receiving two access signals.

20 Claims, 5 Drawing Sheets

METHOD AND APPARATUS FOR SIGNAL ROUTING TO ACHIEVE SIGNAL-EFFICIENCY

BACKGROUND OF THE INVENTION

1. Field of the Invention

This invention relates generally to signal routing, and, more particularly, to a method and apparatus for signal routing to achieve signal-efficiency and reduce signal skew on circuit boards.

2. Description of the Related Art

The proliferation of the high-technology industry has resulted in many innovations that improve our ability to create useful electronic devices. One commodity that is at a premium in electronics devices is the integrated chip. Integrated chips and other specialized electronic circuitry have become integral parts of electronic devices. Therefore, the need to mass-produce integrated chips and other electronic circuitry has generated the need for creative solutions for certain manufacturing issues. Many of these manufacturing issues are not readily contemplated by many in the field. One such issue arises when a testing phase is implemented during the manufacturing of integrated chips and other electronic circuitry.

During the testing phase of semiconductor chips, and other electronic circuitry, multiple sets of a single product are tested together. Generally, to help achieve efficiency in the manufacturing process, devices are tested in groups. To facilitate testing of an array of products, several signals are generally routed between these products and a centralized system. To effectively test the products being manufactured, several or even substantially all of the functionality of a product are tested. To achieve a thorough test of multiple products in a test group, many signals must interface with these products. These signals include data signals, address signals, read control, write control, enable, and other control signals.

Often, there are a substantial number of devices that are tested within a single group. This generally requires a large number of signals that must be routed to each of the devices being tested. Generally, the routing of multiple test-signals leads to significant signal-path lengths and the need to run multiple signals side by side. This causes signal skew problems.

Signal timing is crucial during testing of semiconductor and electronic devices. Many time-critical tests of semiconductor and electronic devices are conducted, particularly during the manufacturing phase. Furthermore, many of these tests are conducted under burn-in conditions. During burn-in conditions, the devices being tested are often isolated in temperature and pressure chambers. These testing chambers should not be disturbed during the testing process. Thus, the accurate performance of the data, address, and control signals that facilitate communications between the devices being tested and the testing system is very important.

The primary problem with state-of-the-art testing procedures is that signal problems, such as propagation delays and other timing problems, often arise. Many times, semiconductor and electronic devices are arranged in arrays on a test-product carrier. The devices being controlled are generally addressed in a logical manner, such as a row and column scheme of addressing using an (x, y)-coordinate system. For example, if an entire column of devices is to be tested, then a selector signal that addresses that particular column is asserted. Also, all of the signals that address the rows are also asserted. The devices that are in the path of the intersection of the asserted column signal and the asserted row signal are addressed. The problem with this arrangement is that errors may occur during accurate timing analysis of the performance of the devices being tested.

The timing problems occur when the devices residing in the first part of the column are turned on slightly sooner than the devices in the latter part of the column, in relation to the signals that were running row-wise. This occurs because the control signals are running in different x, y directions. The timing problem here is a result of signal propagation delay which results in signal skew problems. State-of-the-art testing equipment lacks a routing methodology that allows both selector signals (row selector and column selector) to run in a single access path, reducing the effects of signal skew. Furthermore, current testing equipment lacks a method of addressing multiple devices that compensates for unavoidable signal propagation delays.

A new method of addressing multiple semiconductor and electronic devices that avoids signal skew problems, even in isolated testing situations, is needed. The efficiency of the large amount of testing that takes place in the high technology industry would dramatically improve due to such an innovation. The testing of devices, particularly in isolated conditions, would become more efficient and less costly. Such advancement would dramatically improve manufacturing processes, in terms of efficiency and accuracy, for many high technology industries. Such an innovative addressing scheme can also be used for other applications, including memory array designs, which may lead to new types of semiconductor and electronic devices.

The present invention is directed to overcoming, or at least reducing the effects of, one or more of the problems set forth above.

SUMMARY OF THE INVENTION

The present invention provides for a method of routing electrical signals. The method includes accessing a plurality of electrical circuits. A plurality of electrical circuits are organized into first and second rows. A first portion of the plurality of electrical circuits in the first and second rows, is coupled to a first access signal line. A second portion of the plurality of electrical circuits in the first and second rows is coupled to a second access signal line. The first and second portions of the plurality of electrical circuits in said first row are coupled to a third access signal. The first and second portions of said plurality of electrical circuits in the second row are coupled to a fourth access signal. An access signal is delivered on one of the first and third access signal lines and on one of the second and fourth access signal lines, the electrical circuits being accessed in response to receiving two access signals.

The present invention further comprises of an apparatus. The apparatus includes a supervisory circuit capable of delivering two access signals from a group of first, second, third, and fourth access signals, wherein the supervisory circuit is capable of delivering one of the first and third access signals, and one of the second and fourth access signals. The apparatus further includes a plurality of electrical circuits arranged in a first and second row. A first portion of the plurality of electrical circuits in said first and second rows is adapted to receive the first access signal. A second portion of said plurality of electrical circuits in the first and second rows is adapted to receive a second access signal. The first and second portions of the plurality of electrical circuits in the first row is adapted to receive a third access signal. The first and second portions of said plurality of electrical circuits in the second row is adapted to receive a fourth access signal, said electrical circuits being accessed in response to receiving two access signals.

The present invention further comprises of a method of routing electrical signals. The method includes organizing an electrical circuit into sections as defined by a first and second column and a first and second row. A first and second fixed variable that defines said first and second column is determined. A first and second moveable variable that defines said first and second row is determined. A first and second electrical signal that corresponds to said first and second fixed variable is generated. A first and second electrical signal that corresponds to said first and second moveable variable is generated. The first and second electrical signals corresponding to said first and second fixed variables are routed to each said first and second columns. The first and second electrical signals corresponding to said first and second moveable variable are routed to a portion of a plurality of electrical circuits on the first and second row.

BRIEF DESCRIPTION OF THE DRAWINGS

The invention may be understood by reference to the following description taken in conjunction with the accompanying drawings, in which like reference numerals identify like elements, and in which.

Figure 1:
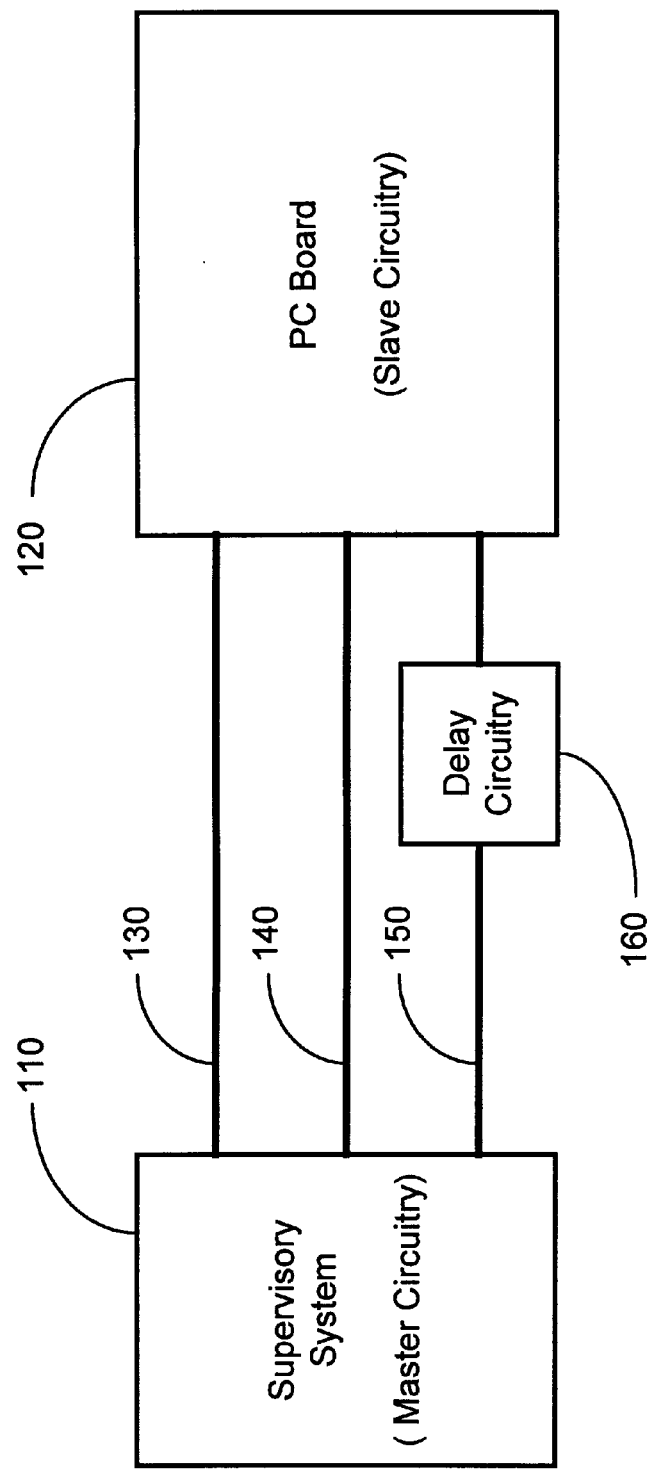
FIG. 1 illustrates a block diagram of an embodiment of an apparatus for the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Turning now to FIG. 1, one embodiment of the present invention is shown. The present invention facilitates improved accessing and testing of electrical circuitry that is arranged in a pattern. A discussion of one context of an embodiment of the present invention follows. On printed circuit (PC) boards that are used for testing devices, such as semiconductor devices, the number of signals available for communications is important. Multiple signals are required for communications between a supervisory system 110, which is a master circuit, and a slave circuit, such as a PC board 120. In one embodiment, the supervisory system 110 is a test stimulus generator that generates test signals and controls electric circuitry on the PC board 120. The PC board 120 often houses multiple electronic devices, such as semiconductor devices, that are tested. To properly write and read data to and from a slave circuitry, such as the PC board 120, a number of interface signals are needed. These interface signals include control signals, such as on a line 130, data signals, such as on a line 140, and addressing/selector signals, such as on a line 150. FIG. 1 also depicts a delay circuitry 160, which is capable of introducing delays upon the addressing/selector signals on a line 150. When a large number of semiconductor devices are tested on the PC board 120, hundreds or even thousands of interface signals would be required. Due to the limitation of the number of interface signals that are available, the semiconductor devices are tested in groups.

Figure 2:
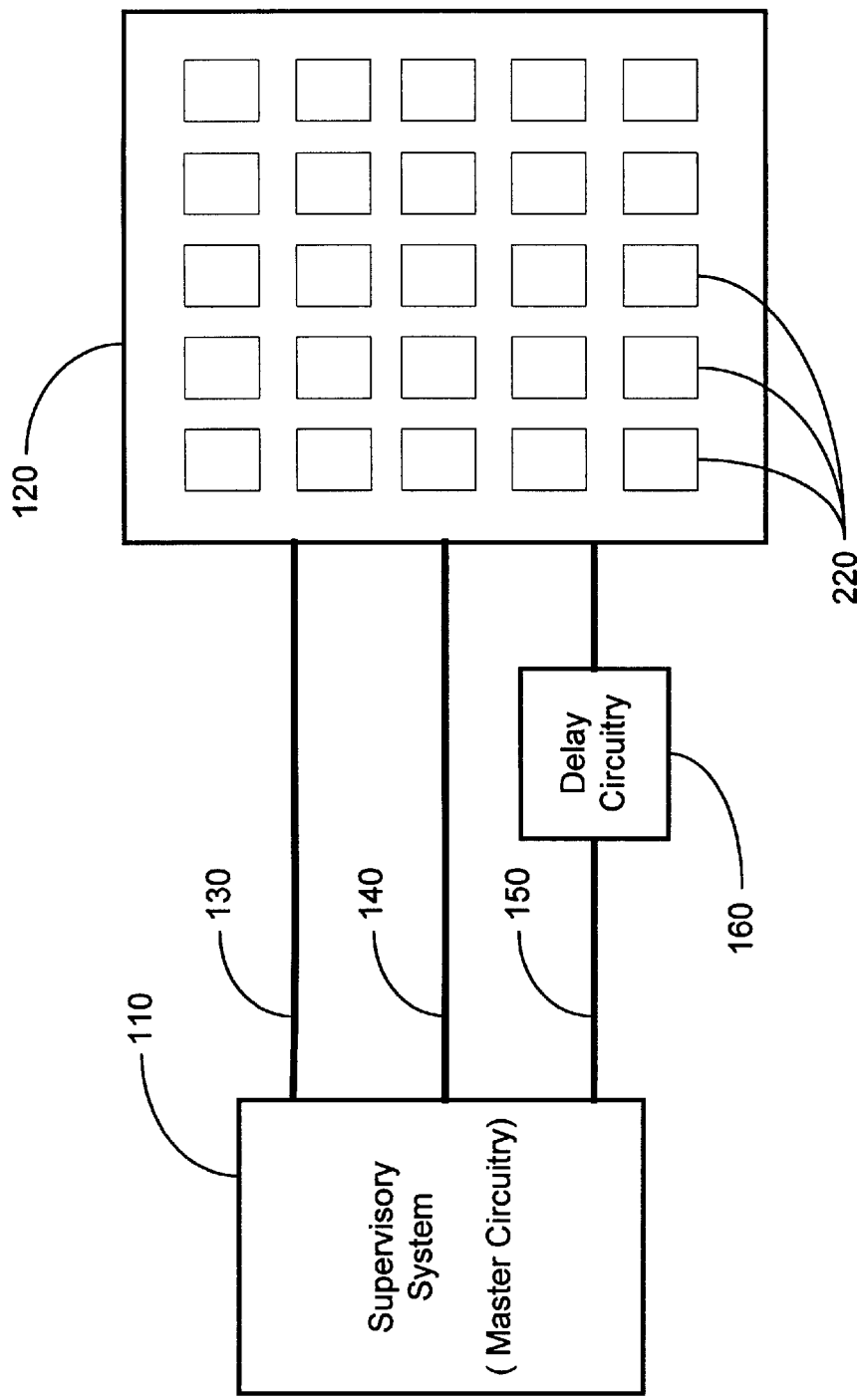
FIG. 2 depicts a more detailed illustration of one embodiment of a PC Board (slave circuitry) of the present invention.

Often, there are a substantial number of devices that are tested within a single group. Therefore, a large number of signals are required to control the devices being tested. FIG. 2 illustrates one embodiment of the present invention. An arrangement of test semiconductor devices 220 is present on the PC board 120, which is controlled by the supervisory system 110. The supervisory system 110 sends multiple control signals to the PC board 120, to control the semiconductor devices 220 housed by the PC board 120. The routing of these signals on the PC board 120 results in significant signal-path lengths and signals being run side by side. This can lead to signal skew problems.

Signal timing is very important during testing of semiconductor and other electronic devices. The timing response of semiconductor devices that are being tested is used to determine whether a particular device passes or fails the test. Furthermore, many of these tests are conducted under burn-in conditions. During burn-in conditions, the PC board 120 that carries the devices 220 being tested is isolated in temperature and pressure chambers (not shown). These chambers generally cannot be disturbed during the testing process. Therefore, accurate test results, delivered by signals coming off-board, are crucial. Timing response variations due to signal skew, rather than variations due to actual performance of devices, can compromise the test results.

Figure 3:
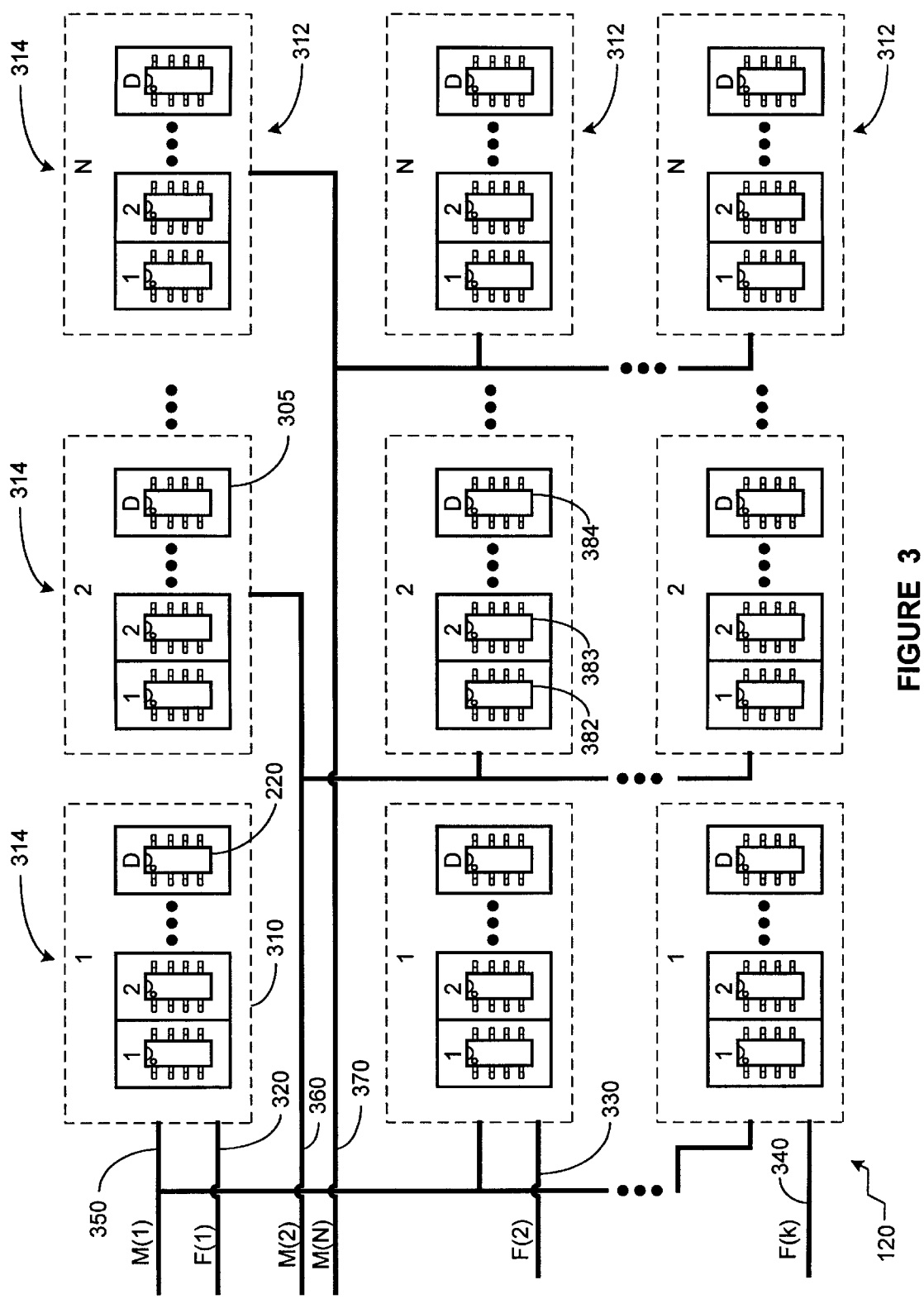
FIG. 3 depicts a more detailed illustration of one embodiment of an implementation of the present invention on a PC Board (slave circuitry)

The signal routing method described in the present invention reduces the effects of signal skew. FIG. 3 illustrates one embodiment of the routing method as described by the present invention. The test semiconductor devices 220 are placed in device blocks 305 that are arranged in a grid format. The device blocks 305 are further arranged into device groups 310. There are a number of device groups 310 (one through N) along a single row 312. There are a number of columns 314 (one through k) that contain several device groups 310 that run along the rows. Multiple selector signals (or control signals) M(1-N), F(1-k) are routed to the device groups 310 to access the test semiconductor devices 220. The arrangement shown in FIG. 3 facilitates the testing of semiconductor devices in groups, using a reduced number of selector signals M(1-N), F(1-k).

The routing method described by the present invention features at least two different signal types of which both are active simultaneously to select a device 220. The selector signals M(1-N), F(1-k) select a group of devices in one of the device groups 310 that are to be active during a period of time. The devices to be tested are arranged in an array, as shown in FIG. 2. Traditionally, devices arranged in this pattern are addressed in a logical manner, such as a row and column scheme of addressing, using an x,y coordinate system. For example, if an entire column of devices is to be tested, then a selector signal that addresses that particular column is asserted. Also, all of the signals that address the rows are also asserted. The devices that are in the path of the intersection of the asserted column signal and the asserted row signal are addressed. The problem with this arrangement is that errors may occur during accurate timing analysis of the performance of the devices being tested.

The timing problems occur when the devices residing in the first part of the column are turned on slightly sooner than the devices in the latter part of the column, in relation to the signals that were running row-wise. This occurs because the control signals are running in different x, y directions. The timing problem here is a result of signal propagation delay, which results in signal skew problems. The state-of-the-art lacks a routing methodology that allows both selector signals (row selector and column selector) to run in a single access path, reducing the effects of signal skew. The present invention reduces the aforementioned problems.

The array of devices shown in FIG. 2 can be further organized into groups, as illustrated in FIG. 3. FIG. 3 illustrates one embodiment of the implementation of the present invention. The semiconductor devices to be tested are subdivided into device groups 310. Each device group 310 contains a predetermined number of devices (D). In one embodiment, there are N number of device groups 310 in each row. Several selector signals are routed to the device groups 310. There are two different types of selector signals, both of which have to be active to select a device. Of the two selector signal types, one is a fixed selector signal and the other is a moveable selector signal. Generally, there will be one fixed selector signal for each row 312 or column 314, whereas the moveable selector signal "moves" or activates different device groups 310 in a row 312 or a column 314. The fixed selector signal is labeled F, shown on lines 320, 330, and 340. The moveable selector signal is labeled M, shown on lines 350, 360, and 370.

Figure 4:
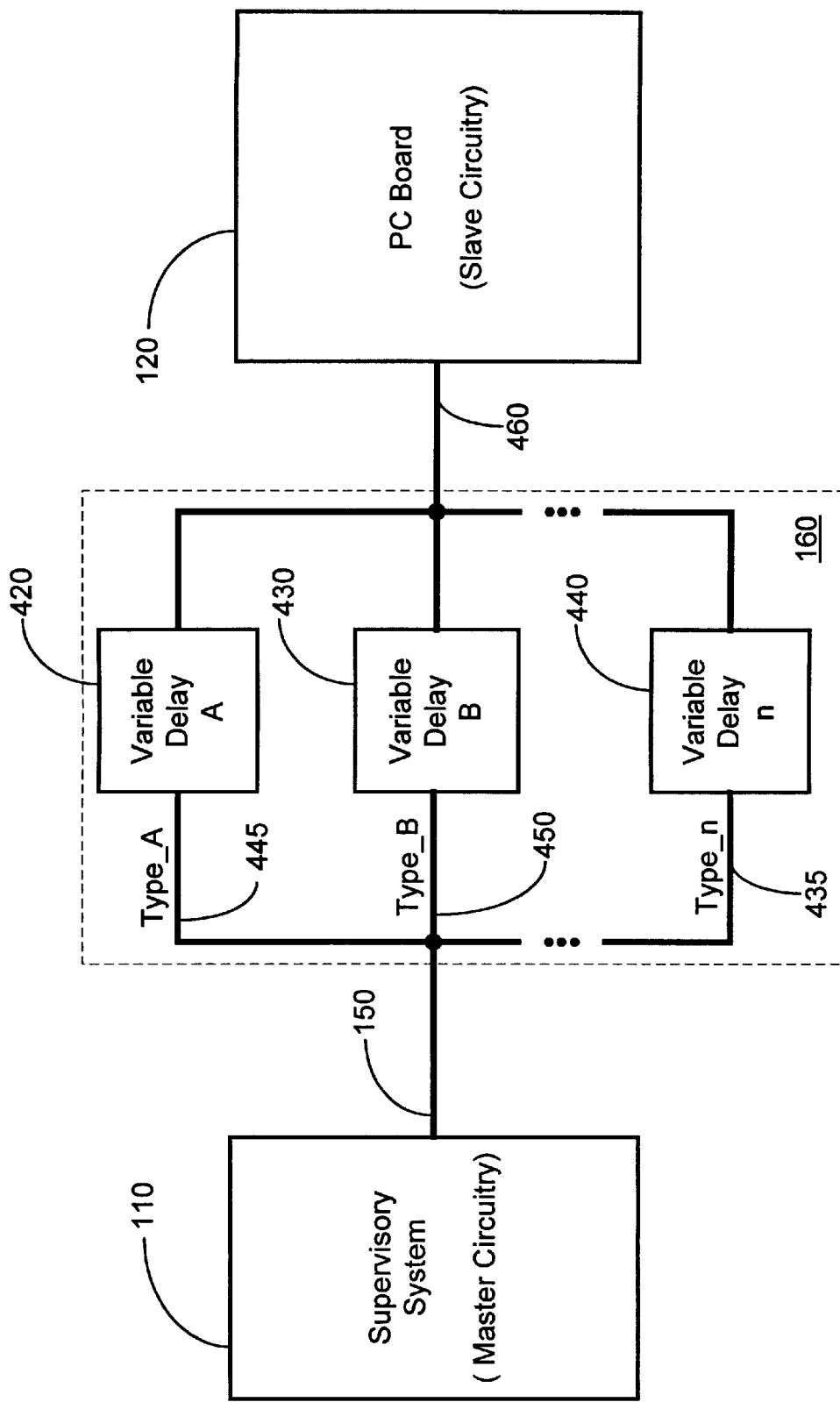
FIG. 4 illustrates a block diagram illustrating the variable delay that is employed in the embodiment of the apparatus for the present invention.

The selector signals are sent through variable delays, in the delay circuitry 160, to reduce the relative skew that may occur between selector signals. FIG. 4 illustrates an embodiment in which the timing of the selector signals can be adjusted. Multiple selector signals on a line 150 are sent from the supervisory system 110, to variable delays 420, 430, and 440. Selector signal type-A, on a line 445, is sent to the variable delay A 420. Likewise, selector signal type-B (on a line 450) and selector signal type-n (on a line 435), are sent to the variable delay B 430 and the variable delay n 440, respectively. The variable delays 420, 430, 440 introduce delays in the timing of the selector signals such that the relative skews between selector signals are reduced. Once the selector signals are de-skewed, they will remain de-skewed. Once the relative skews between selector signals are reduced, the de-skewed selector signals are sent to the PC board 120, on a line 460.

In one embodiment, for an array of devices, such as the array illustrated in FIG. 3, one axis (x or y) is the predominant direction to route selector signals. In one embodiment, this direction will be the row direction. The direction perpendicular to the rows is the column direction. The device groups 310 are organized as one row by D columns, where D is the number of devices in one device group 310. N is the number of device groups 310 along one row 312.

In one embodiment, one fixed signal F is routed to each row 312, for the full length of the row. In other words, one fixed signal F will select all device groups 310 in one row 312. The moveable signals M will be grouped so that each N adjacent row will have a number of M signals that is equal to the number N. In other words, there will be one M signal for each device group 310 in a row. The moveable signals M may move from row to row, but only at device boundaries. In other words, in one embodiment, one moveable selector signal M can activate all device groups 310 in one column, but not individual devices within a device group 310. For example, referring to FIG. 3, one moveable signal, such as M(2), can activate all second device groups 310 in a column 314. However, the devices 220 in any particular device group 310 will not be fully activated unless the fixed selector signal F that corresponds to that row is also active. For example, if the movable selector signal M(2) is active, and the fixed selector signal F(2) is active, then devices 382, 383, and 384 will become active. The moveable selector signals are routed so that each M signal within a row visits all groups 310 within that row exactly once. In an alternative embodiment, the function of the rows and columns are interchangeable. This routing method reduces the effects of signal skew The routing method, as prescribed by the present invention, allows both selector signals to run in one access cycle from the supervisory system 110. Signal propagation delays may still exist for both of the selector signals relative to a target device. However, both of the selector signals will arrive at a target device at approximately the same time. Therefore, from the point of view of the target device under test, both of the selector signals arrive at the same time. This helps to reduce timing problems due to the effects of signal propagation delays.

Figure 5:
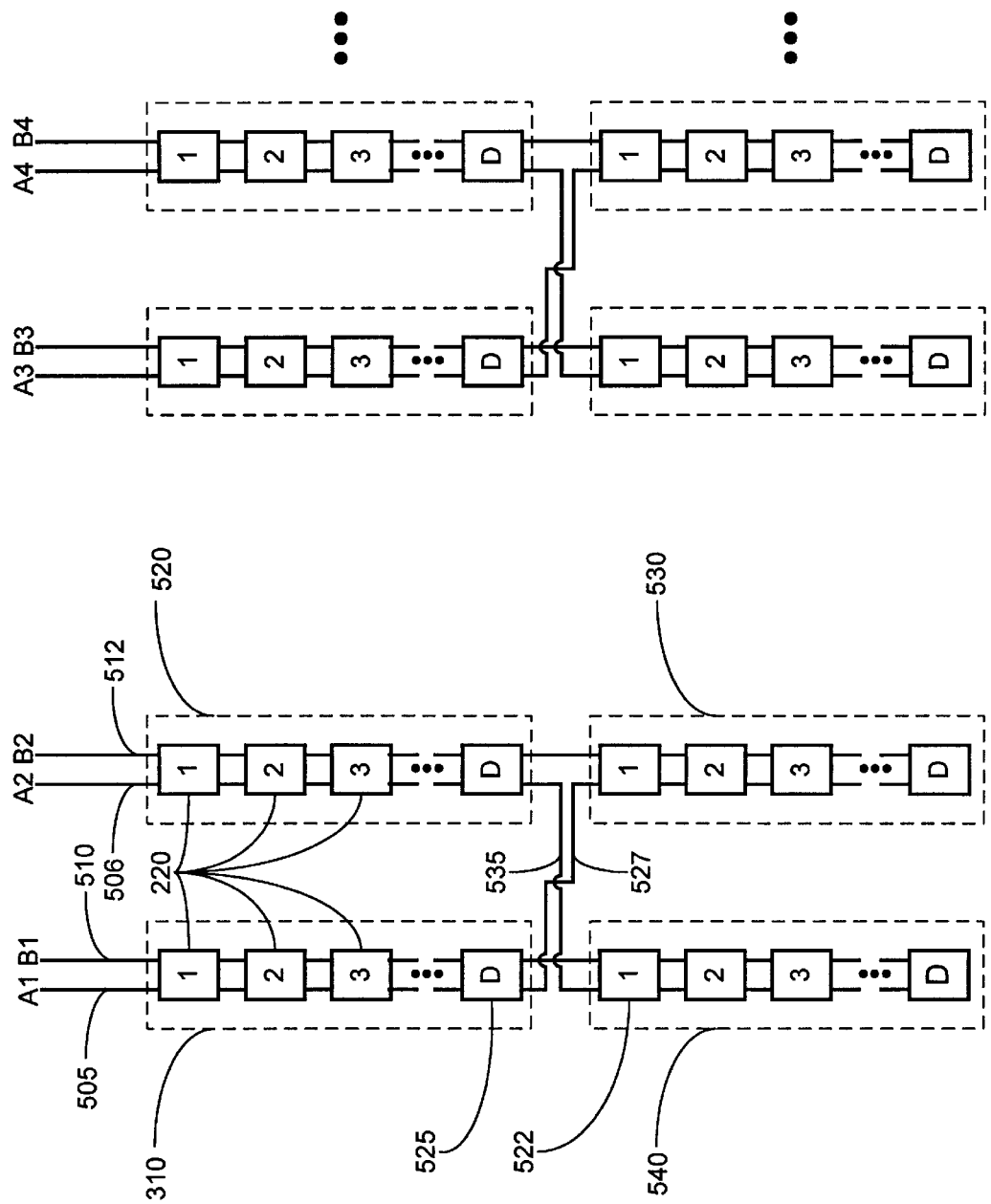
FIG. 5 depicts a detailed illustration of a column-wise embodiment of the present invention.

FIG. 5 illustrates a column-wise embodiment of the present invention. The signal on a line 505, A1, and the signal on a line 506, A2 are selector signals that are moveable. In other words, the signals A1 and A2, on the lines 505 and 506, move from one device group 310 to another. The signals on a line 510, B1, and a line 512, B2 are fixed selector signals. When selector signals A1 and B1 are asserted, the device group 310 is selected, waking up all of the devices 220 within the device group 310. When the selector signals A2 and B2 are asserted, the device group 520 is selected.

The moveable selector signals A1 and A2 can move from one device group 310 to another at device group 310 boundaries. In other words, the moveable selector signals can crossover to another device group either at a device number-1 522, or at a device number-D 525. Furthermore, the moveable selector signals A1 and A2 visit a column of devices 220 within the device group 310 only once. By crossing-over the moveable selector signal A1 to a different device group 530, on a line 527, and asserting selector signals A1 and B2, the device group 530 is selected. By crossing-over the moveable selector signal A2 to the device group 530, on a line 535, and asserting the selector signals A2 and B1, device group 540 is selected.

The moveable selector signals A1 and A2 are crossed-over to different device groups 310 to select specific groups of devices. The variable delays, as described in FIG. 4, are invoked such that each selector signal is de-skewed from other selector signals. Thus, the two selector signals that select the various device groups 310, in FIG. 5, arrive with reduced signal skew with respect to each other. Therefore, the effects of timing variations on the selector signals are reduced.

The routing principles taught by the present invention can be implemented in other embodiments, such as a routing methodology for accessing memory cells in memory devices. The routing method of the present invention can be applied to gain memory access and reduce the effects of signal skew. This feature is particularly important in applications that tend to operate at relatively high speeds. The routing method of the present invention may be used to access a group of memory locations at one time, or access individually memory locations.

It will be appreciated by those of ordinary skill in the art having the benefit of this disclosure that numerous variations from the foregoing illustration will be possible without departing from the inventive concept described herein. Accordingly, it is the claims set forth below, and not merely the foregoing illustration, which are intended to define the exclusive rights of the invention.

What is claimed:

1. A method of accessing a plurality of electrical circuits, comprising:

organizing said plurality of electrical circuits into first and second rows;

coupling a first portion of said plurality of electrical circuits in said first and second rows to a first access signal line;

coupling a second portion of said plurality of electrical circuits in said first and second rows to a second access signal line;

coupling said first and second portions of said plurality of electrical circuits in said first row to a third access signal line;

coupling said first and second portions of said plurality of electrical circuits in said second row to a fourth access signal line;

delivering a first access signal on one of said first and second access signal lines and a second access signal on one of said third and fourth access signal lines;

determining a transit time for each of the first and second access signals to be received by the first and second portions of the plurality of electrical circuits in each of the first and second rows; and delaying one of said first and second access signals by a period of time corresponding to a difference between the transit time for the first access signal and the transit time for the second access signal.

2. The method of claim 1, wherein organizing includes arranging the first portion of the first row and the second portion of the second row in a first column, and the second portion of the first row and the first portion of the second row in a second column.

3. An apparatus, comprising:

a plurality of electrical circuits arranged in first and second rows, a first portion of said plurality of electrical circuits in each of said first and second rows being coupled to a first access signal line, a second portion of said plurality of electrical circuits in each of said first and second rows being coupled to a second access signal line, said first and second portions of said plurality of electrical circuits in said first row being coupled to a third access signal line, and said first and second portions of said plurality of electrical circuits in said second row being coupled to a fourth access signal line;

a supervisory circuit capable of providing a first access signal for application to one of said first and second access signal lines and capable of providing a second access signal for application to one of said third and fourth access signal lines, said first and second access signals each having a transit time; and a delay circuit coupled to receive one of said first and second access signals and adapted to delay, for a period corresponding to the difference in the transit times of the first and second access signals, said one of said first and second access signals relative to the other of said first and second access signals, said delay circuit adapted to apply said first and second access signals to one of said first and second access signal lines and to one of said third and fourth access signal lines, respectively.

4. The apparatus of claim 3, wherein the delay circuit has a variable delay period.

5. The apparatus of claim 4, wherein the variable delay period corresponds to the difference in the transit times of the first and second access signals.

6. The apparatus of claim 3, wherein said electrical circuits are semiconductor devices.

7. The apparatus of claim 3, wherein said electrical circuits are semiconductor memory devices.

8. The apparatus of claim 3, wherein the delay circuit is coupled to receive said first access signal and said second access signal, said delay circuit adapted to delay one of said first and second access signals relative to the other of said first and second access signals.

9. The apparatus of claim 3, wherein said electrical circuits comprise semiconductor memory storage elements in a semiconductor memory integrated circuit.

10. A method of accessing a plurality of electrical circuits, comprising:

organizing said plurality of electrical circuits into first and second columns;

coupling a first portion of said plurality of electrical circuits in each of said first and second columns to a first access signal line;

coupling a second portion of said plurality of electrical circuits in each of said first and second columns to a second access signal line;

coupling said first and second portions of said plurality of electrical circuits in said first column to a third access signal line;

coupling said first and second portions of said plurality of electrical circuits in said second column to a fourth access signal line; and delivering a first access signal on one of said first and second access signal lines and a second access signal on one of said third and fourth access signal lines;

determining a transit time for each of the first and second access signals to be received by the first and second portions of the plurality of electrical circuits in each of the first and second columns; and delaying one of said first and second access signals by a period of time corresponding to a difference between the transit time for the first access signal and the transit time for the second access signal.

11. The method of claim 10, wherein organizing includes arranging the first portion of the first column and the second portion of the second column in a first row, and the second portion of the first column and the first portion of the second column in a second row.

12. An apparatus, comprising:

a plurality of electrical circuits arranged in first and second columns, a first portion of said plurality of electrical circuits in each of said first and second columns being coupled to a first access signal line, a second portion of said plurality of electrical circuits in each of said first and second columns being coupled to a second access signal line, said first and second portions of said plurality of electrical circuits in said first column being coupled to a third access signal line, and said first and second portions of said plurality of electrical circuits in said second column being coupled to a fourth access signal line;

a supervisory circuit capable of providing a first access signal for application to one of said first and second access signal lines and capable of providing a second access signal for application to one of said third and fourth access signal lines, said first and second access signals each having a transit time; and a delay circuit coupled to receive one of said first and second access signals and adapted to delay, for a period corresponding to the difference in the transit times of the first and second access signals, said one of said first and second access signals relative to the other of said first and second access signals, said delay circuit adapted to apply said first and second access signals to one of said first and second access signal lines and to one of said third and fourth access signal lines, respectively.

13. The apparatus of claim 12, wherein the delay circuit has a variable delay period.

14. The apparatus of claim 13, wherein the variable delay period corresponds to the difference in the transit times of the first and second access signals.

15. The apparatus of claim 12, wherein said electrical circuits are semiconductor devices.

16. The apparatus of claim 12, wherein said electrical circuits are semiconductor memory devices.

17. The apparatus of claim 12, wherein the delay circuit is coupled to receive said first access signal and said second access signal, said delay circuit adapted to delay one of said first and second access signals relative to the other of said first and second access signals.

18. The apparatus of claim 12, wherein said electrical circuits comprise semiconductor memory storage elements in a semiconductor memory integrated circuit.

19. A method of routing electrical signals, comprising:

organizing an electrical circuit into sections as defined by first and second columns and first and second rows;

determining first and second fixed variables that define said first and second columns;

determining first and second moveable variables that define said first and second rows;

generating first and second electrical signals that correspond to said first and second fixed variables;

generating third and fourth electrical signals that correspond to said first and second moveable variables;

controllably routing said first and second electrical signals to said first and second columns, respectively;

controllably routing said third and fourth electrical signals to one of first and second portions, respectively, of each of the first and second rows;

determining a transit time for each of the controllably routed electrical signals to be received by selected portion of the electrical circuit; and delaying a first one of said controllably routed electrical signals by a period of time determined, at least in part, by the difference between the transit time for the first one of said controllably routed electrical signals and the transit time for another of the controllably routed electrical signals.

20. The method of claim 19, further comprising:

controllably routing said first and said second electrical signals to said first and second columns, respectively;

controllably routing said third and said fourth electrical signals to said first and second portions, respectively, of each of said first and second rows; and delaying at least one of said controllably routed first, second, third and fourth electrical signals relative to at least one other controllably routed first, second, third, and fourth electrical signals.

* * * * *

UNITED STATES PATENT AND TRADEMARK OFFICE
CERTIFICATE OF CORRECTION

PATENT NO. : 6,061,509
DATED : May 9, 2000
INVENTOR(S) : Charles K. Snodgrass, Robert L. Totorica, David A. Reichle and Charles S. Alexander It is certified that error appears in the above-identified patent and that said Letters Patent is hereby corrected as shown below:

Column 10, line 23 (Claim 19, line 18), before "selected" insert -- a --.

Signed and Sealed this

Twentieth Day of February, 2001

Attest:

NICHOLAS P. GODICI

Attesting Officer

Acting Director of the United States Patent and Trademark Office